United States Patent [19]
Segawa et al.

[11] Patent Number: 5,523,721
[45] Date of Patent: Jun. 4, 1996

[54] DIGITALLY CONTROLLED VARIABLE GAIN CIRCUIT

[75] Inventors: Yuji Segawa; Yukinori Abe; Kunihiko Gotoh, all of Kawasaki, Japan

[73] Assignee: Fujitsu Limited, Kawasaki, Japan

[21] Appl. No.: 395,199

[22] Filed: Feb. 27, 1995

Related U.S. Application Data

[63] Continuation of Ser. No. 63,427, May 19, 1993, abandoned.

[30] Foreign Application Priority Data

May 20, 1992 [JP] Japan ..................... 4-127285

[51] Int. Cl.⁶ .................. H03F 1/34; H03G 3/30
[52] U.S. Cl. .............. 330/86; 330/144; 330/282; 330/284; 333/81 R
[58] Field of Search ............. 330/86, 144, 145, 330/282, 284; 333/81 R

[56] References Cited

U.S. PATENT DOCUMENTS

| | | | |
|---|---|---|---|
| 5,165,099 | 11/1992 | Onaya et al. | 333/81 R X |
| 5,216,355 | 6/1993 | Terada et al. | 333/81 R X |
| 5,339,021 | 8/1994 | Thomson | 333/81 R X |

FOREIGN PATENT DOCUMENTS

| | | | |
|---|---|---|---|
| 200623 | 11/1983 | Japan | 330/284 |
| 62-173809 | 7/1987 | Japan . | |
| 63-156410 | 6/1988 | Japan . | |
| 318307 | 12/1989 | Japan | 330/284 |
| 3-255722 | 11/1991 | Japan . | |
| 1301696 | 1/1973 | United Kingdom | 330/86 |

*Primary Examiner*—James B. Mullins
*Attorney, Agent, or Firm*—Staas & Halsey

[57] ABSTRACT

A digitally controlled variable gain circuit which receives an analog input voltage and produces an analog output voltage. The digitally controlled variable gain circuit includes a first resistor string having first and second ends and a plurality of resistors connected in series between the first and second ends, the second end of the first resistor string being grounded and the analog input voltage being applied across the first and second ends of the first resistor string. A first selection mechanism, coupled to the first resistor string and responsive to a first digital control signal, provides a selectively determinable voltage divided output from the first resistor string. A second resistor string has first and second ends and a plurality of resistors connected in series between the first and second ends, the second end of the second resistor string being grounded and the voltage divided output provided by the first selection mechanism being applied across the first and second ends of the second resistor string. A second selection mechanism, coupled to the second resistor string and responsive to a second digital control signal, provides a selectively determinable voltage divided output from the second resistor string as the analog output voltage.

30 Claims, 13 Drawing Sheets

FIG. 8(a)

| 1ST DIGITAL CONTROL SIGNAL | | | SWITCH WHICH TURNS ON | $20\log_{10}\dfrac{V_A}{V_{IN}}$ |
|---|---|---|---|---|
| D5 | D4 | D3 | | |
| 1 | 1 | 1 | S101 | 0 (dB) |
| 1 | 1 | 0 | S102 | −4 |
| 1 | 0 | 1 | S103 | −8 |
| 1 | 0 | 0 | S104 | −12 |
| 0 | 1 | 1 | S105 | −16 |
| 0 | 1 | 0 | S106 | −20 |
| 0 | 0 | 1 | S107 | −24 |
| 0 | 0 | 0 | S108 | −28 |

STEP OF 4dB

FIG. 8(b)

| 2ND DIGITAL CONTROL SIGNAL | | | SWITCH WHICH TURNS ON | $20\log_{10}\dfrac{V_{OUT}}{V_A}$ |
|---|---|---|---|---|
| D2 | D1 | D0 | | |
| 1 | 1 | 1 | — | 0 (dB) |
| 1 | 1 | 0 | S142 | −0.5 |
| 1 | 0 | 1 | S143 | −1.0 |
| 1 | 0 | 0 | S144 | −1.5 |
| 0 | 1 | 1 | S145 | −2.0 |
| 0 | 1 | 0 | S146 | −2.5 |
| 0 | 0 | 1 | S147 | −3.0 |
| 0 | 0 | 0 | S148 | −3.5 |

STEP OF 0.5dB

FIG. 12(a)

| 1ST DIGITAL CONTROL SIGNAL | | | SWITCH WHICH TURNS ON | $20\log_{10}\dfrac{V_A}{V_{IN}}$ |
|---|---|---|---|---|
| D5 | D4 | D3 | | |
| 1 | 1 | 1 | S51 | 0 (dB) |
| 1 | 1 | 0 | S52 | −4 |
| 1 | 0 | 1 | S53 | −8 |
| 1 | 0 | 0 | S54 | −12 |
| 0 | 1 | 1 | S55 | −16 |
| 0 | 1 | 0 | S56 | −20 |
| 0 | 0 | 1 | S57 | −24 |
| 0 | 0 | 0 | S58 | −28 |

STEP OF 4dB

FIG. 12(b)

| 2ND DIGITAL CONTROL SIGNAL | | | SWITCH WHICH TURNS ON | $20\log_{10}\dfrac{V_{OUT}}{V_A}$ |
|---|---|---|---|---|
| D2 | D1 | D0 | | |
| 1 | 1 | 1 | S71 | 0 (dB) |
| 1 | 1 | 0 | S72 | −0.5 |
| 1 | 0 | 1 | S73 | −1.0 |
| 1 | 0 | 0 | S74 | −1.5 |
| 0 | 1 | 1 | S75 | −2.0 |
| 0 | 1 | 0 | S76 | −2.5 |
| 0 | 0 | 1 | S77 | −3.0 |
| 0 | 0 | 0 | S78 | −3.5 |

STEP OF 0.5dB

DIGITALLY CONTROLLED VARIABLE GAIN CIRCUIT

This application is a continuation of application Ser. No. 08/063,427, filed May 19, 1993, now abandoned.

BACKGROUND OF THE INVENTION

The present invention generally relates to digitally controlled variable gain circuits, and more particularly to a digitally controlled variable gain circuit which attenuates or amplifies an analog input voltage depending on a digital control value. The digitally controlled variable gain circuit is sometimes also referred to as an electronic volume.

Recently, due to the improved performances of various electronic equipments for public and industrial uses, there are now demands for making fine and highly accurate adjustments of signal levels within a circuit.

It is effective to digitize the electronic equipment in order to improve the performance thereof, however, it is impossible to treat all signals as digital quantities. For example, when an audio signal or the like is converted into a digital quantity, it is impossible to reproduce the original signal with a 100% fidelity, although dependent on the sampling frequency and conversion technique used.

Accordingly, an analog processing part is in many cases included in a part of the digital equipment, and a digitally controlled variable gain circuit is used in this analog processing part to adjust the level of the analog signal.

FIG. 1 shows an example of a general application of the digitally controlled variable gain circuit. In this example, an analog block 1 generates an analog signal 2 or carries out a predetermined process on a signal to form the analog signal 2. This analog signal 2 is input to a digitally controlled variable gain circuit 3. An analog signal 4 output from the digitally controlled variable gain circuit 3 is input to an analog block 5 of the next stage.

A digital control signal 6 having a plurality of bits is applied to the digitally controlled variable gain control circuit 3. The digitally controlled variable gain control circuit 3 generates the analog signal 4 by attenuating or amplifying the analog sign. 2 depending on the content of the digital control signal 6. The attenuation or amplification can finely be controlled in digital quantities, and the level of the analog signal 4 can be adjusted finely and with a high accuracy.

FIG. 2 shows a first example of the conventional digitally controlled variable gain circuit 3. One example of this type of variable gain circuit is proposed in a Japanese Laid-Open Patent Application No. 63-156410.

The digitally controlled variable gain circuit shown in FIG. 2 includes a resistor string 6 made up of n resistors R1, R2, . . . , Rn which are connected is series, n switches S1 through Sn, and a decoder ?. An analog input voltage $V_{IN}$ is applied across the ends of the resistor string 6, and one of divided voltages from nodes connecting the resistors i output via one of the switches S1 through Sn which turns ON responsive to an n-bit output of the decoder as an analog output voltage $V_{OUT}$. In other words, one of the n kinds of voltages including the analog input voltage $V_{IN}$ is selected and output as the analog output voltage $V_{OUT}$ depending on a control signal which is input to the decoder ?. The voltage varying step is dependent on the number n of the resistors and switches.

However, according to the first example of the conventional digitally controlled variable gain circuit, there was a problem in that the scale of the circuit becomes large compared to the control resolution because the number of voltage varying steps is dependent on the number n of the resistors and switches.

FIG. 3 shows a second example of the conventional digitally controlled variable gain circuit 3. Examples of this type of variable gain circuit are proposed in Japanese Laid-Open Patent Applications No. 62-173809 and No. 3-255722.

The digitally controlled variable gain circuit shown in FIG. 3 generally includes a first stage part 9 and a second stage part 12 which are coupled via an operational amplifier 10. The first stage part 9 is made up of a first resistor string 8 having n resistors R11, R12, . . . , R1n connected in series, and n switches S11, S12, . . . , S1n. The operational amplifier 10 is operated by high and low power source voltages +V and −V. The second stage part 12 is made up of a second resistor string 11 having n resistors R21, R22, . . . , R2n connected in series, and n switches S21, S22, . . . , S2n.

According to this second example of the conventional digitally controlled variable gain circuit, the analog input voltage $V_{IN}$ can be attenuated by the first stage part 9, and further attenuated by the second stage part 12. Hence, it is possible to make the voltage varying step correspond to a product of the number of varying steps of the first stage part 9 and the number of varying steps of the second stage part 12. But in this case, an output of the first stage part 9 is applied to a non-inverting input terminal of the operational amplifier 10, and a voltage from the second resistor string 11 is applied to an inverting input terminal of the operational amplifier 10. For this reason, there was a problem in that an operation point of the operational amplifier 10 falls outside the tolerable operation range if the operational amplifier 10 is operated by the lower power source voltage of 2 V, for example.

Generally, the tolerable operation range of the operational amplifier is given between the potential which is approximately 1 V lower than the high potential side power source voltage +V and the potential which is approximately 1 V higher than the low potential side power source voltage −V. For example, if +V=5 V and −V=0 V, the tolerable operation range becomes approximately 3 V. Accordingly, if the operational amplifier is operated by a lower power source voltage of approximately 2 V, it is only possible to obtain an operation range which is extremely narrow and corresponds to an approximate middle potential of the power source voltage.

In addition, if the operational amplifier uses an offset voltage, there is also a problem in that the offset voltages changes when the feedback resistance of the operational amplifier is varied.

SUMMARY OF THE INVENTION

Accordingly, it is a general object of the present invention to provide a novel and useful digitally controlled variable gain circuit in which the problems described above are eliminated.

Another and more specific object of the present invention is to provide a digitally controlled variable gain circuit for outputting an analog output voltage based on an analog input voltage comprising a first resistor string having first and second ends and including a plurality of resistors which are connected in series, where the analog input voltage is applied across the first and second ends, first means, coupled to the first resistor string, for selectively outputting one of first divided voltages output from the first resistor string in response to a first digital control signal, a second resistor string having third and fourth ends and including a plurality of resistors which are connected in series, where the one first divided voltage is applied across the third and fourth ends, and second means, coupled to the second resistor string, for selectively outputting as the analog output voltage one of second divided voltages output from the second resistor string in response to a second digital control signal. According to the digitally controlled variable gain circuit of the present invention, it is possible to improve the control resolution without increasing the scale of the circuit.

Still another object of the present invention is to provide a digitally controlled variable gain circuit for outputting an analog output voltage based on an analog input voltage comprising a first resistor string having first and second ends and including a plurality of resistors which are connected in series, where the analog input voltage is applied across the first and second ends, first means, coupled to the first resistor string, for selectively outputting one of first divided voltages output from the first resistor string in response to a first digital control signal, an input resistor, an operational amplifier having an inverting input terminal supplied with the one first divided voltage from the first means via the input resistor, a non-inverting input terminal supplied with a reference voltage and an output terminal for outputting the analog output voltage, and feedback means, coupled between the output terminal and the inverting input terminal of the operational amplifier, for feeding back the analog output voltage output from the output terminal of the operational amplifier to the inverting input terminal of the operational amplifier via a feedback resistance which is selected in response to a second digital control signal. According to the digitally controlled variable gain circuit of the present invention, it is possible to guarantee the stable operation of the operational amplifier even when operated by a lower power source voltage.

Other objects and further features of the present invention will be apparent from the following detailed description when read in conjunction with the accompanying drawings.

BRIEF DESCRIPTION OF THE DRAWINGS

FIG. 8(A) and FIG. 8(B) show the relationships of a digital control signal, switches which turn ON, and attenuation of each resistor string;

FIG. 12(A) and FIG. 12(B) show the relationship of a digital control signal, switches which turn ON, and attenuation of each resistor string;

DESCRIPTION OF THE PREFERRED EMBODIMENTS

A description will be given of the operating principle of a first embodiment of a digitally controlled variable gain circuit according to the present invention, by referring to FIGS. 4 and 5. The object of this first embodiment is to improve the control resolution without increasing the scale of the circuit.

Figure 4:
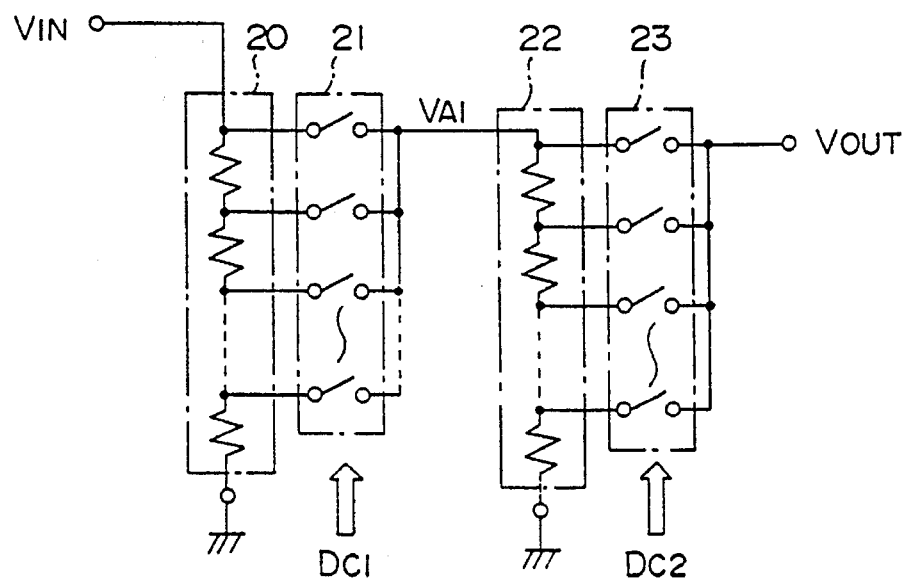
FIG. 4 is a circuit diagram for explaining the operating principle of a first embodiment of a digitally controlled variable gain circuit according to the present invention.

FIG. 4 shows an essential part of the first embodiment. As shown in FIG. 4, an analog input voltage $V_{IN}$ is applied across the ends of a first resistor string 20. A voltage generated at each part of the first resistor string 20 is obtained as a voltage $V_{A1}$ by a first switch group 21 which is selectively turned ON/OFF in response to a first digital control signal $D_{C1}$. The voltage $V_{A1}$ obtained from the first switch group 21 is applied across the ends of a second resistor string 22. A voltage generated at each part of the second resistor string 22 is obtained by a second switch group 23 which is selectively turned ON/OFF in response to a second digital control signal $D_{C2}$, and output as an analog output voltage $V_{OUT}$.

Figure 5:
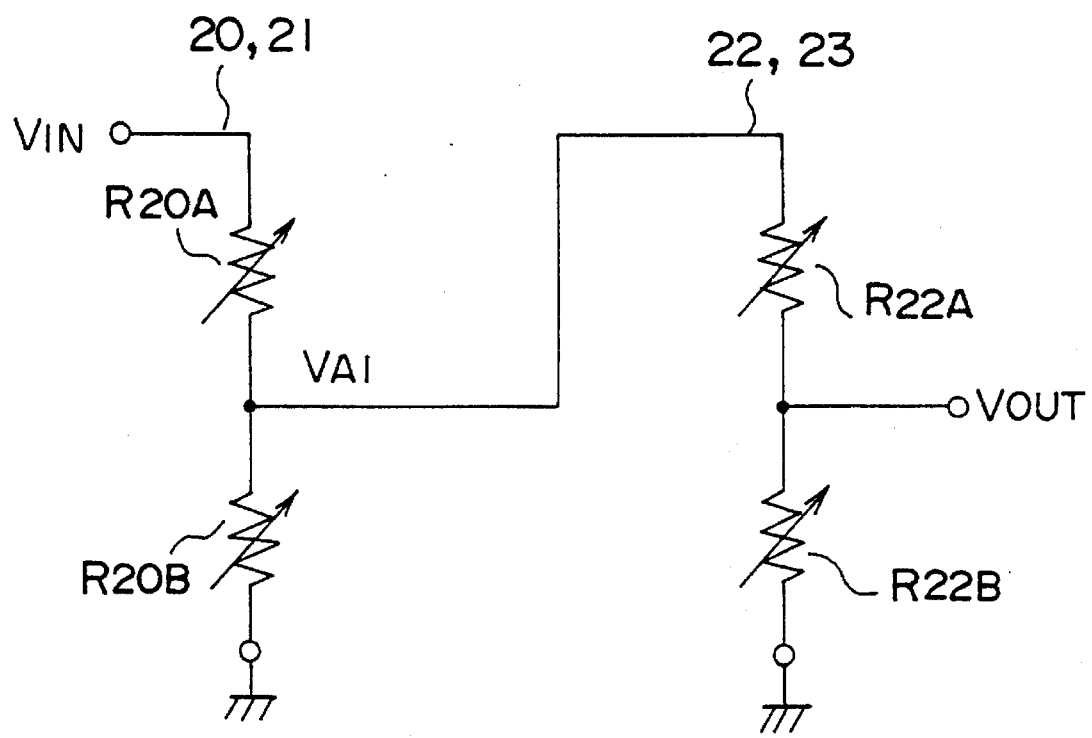
FIG. 5 is a diagram for explaining the operation of the first embodiment.

FIG. 5 is a diagram for explaining the operation of the first embodiment. In FIG. 5, $R_{20A}$ and $R_{20B}$ respectively indicate values of voltage dividing resistors which are within the first resistor string 20 and are selected by the first digital control signal $D_{C1}$. In addition, $R_{22A}$ and $R_{22B}$ respectively indicate values of voltage dividing resistors which are within the second resistor string 22 and are selected by the second digital control signal $D_{C2}$. The following formulas (1) and (2) can be derived from the relationships of these voltage dividing resistors $R_{20A}$, $R_{20B}$, $R_{22A}$ and $R_{22B}$ and the voltages $V_{IN}$, $V_{A1}$ and $V_{OUT}$.

$$V_{A1}/V_{IN} = \{R_{20B}(R_{22A} + R_{22B})\} / \{R_{20A}(R_{20B} + R_{22A} + R_{22B}) + R_{20B}(R_{22A} + R_{22B})\} \quad (1)$$

$$\begin{aligned} V_{OUT}/V_{IN} &= \{R_{22B}/(R_{22A} + R_{22B})\} V_{A1}/V_{IN} \quad (2) \\ &= R_{20B} \cdot R_{2B}/\{R_{20A}(R_{20B} + R_{22A} + R_{22B}) + R_{20B}(R_{22A}R_{22B})\} \end{aligned}$$

As may be seen from the formula (1), the voltage $V_{A1}$ is dependent on a total resistance $(R_{22A}+R_{22B})$ of the second resistor string 22, but is independent of a voltage dividing ratio of the second resistor string 22. In other words, it is possible to set mutually independent voltage dividing ratios to the first and second resistor strings 20 and 22. Hence, it is possible to obtain a number of voltage varying steps in multiple stages corresponding to a product of the two voltage dividing ratios of the first and second resistor strings 20 and 22, and improve the control resolution without increasing the scale of the circuit.

Next, a more detailed description will be given of the first embodiment, by referring to FIGS. 6 through 8.

Figure 6:
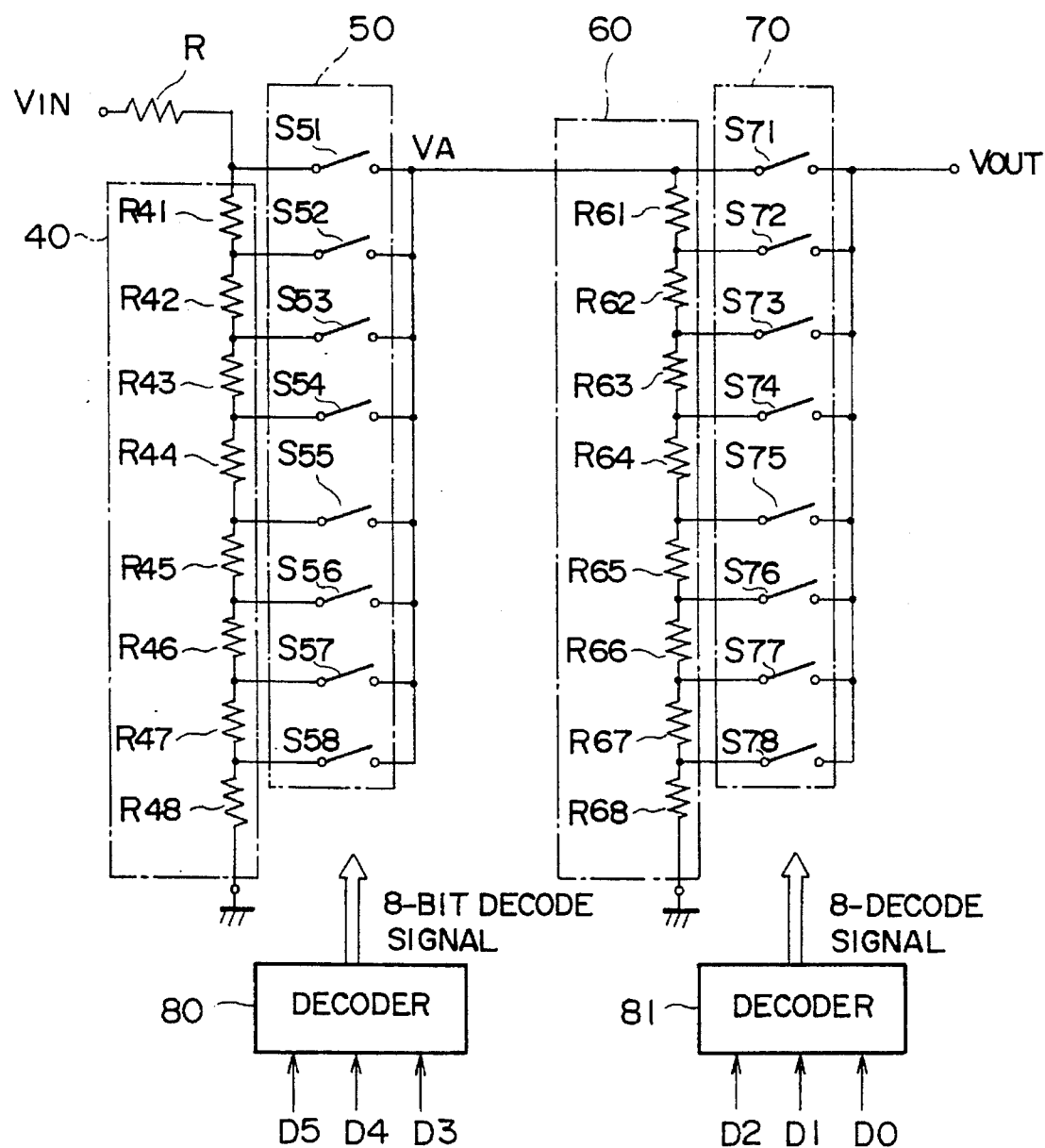
FIG. 6 is a circuit diagram showing the first embodiment.

FIG. 6 shows the first embodiment. As shown in FIG. 6, the digitally controlled variable gain circuit includes a first resistor string 40, a first switch group 50, a second resistor string 60, a second switch group 70, and first and second decoder circuits 80 and 81. These decoder circuits 80 and 81 may also be considered as an external circuit to the digitally controlled variable gain circuit.

The first resistor string 40 is made up of eight resistors R41, R42, . . . , and R48 which are connected in series, and the analog input voltage $V_{IN}$ is applied across the ends of the first resistor string 40. The first switch group 50 is made up of eight switches S51, S52, . . . , and S58, and each of the switches S51, S52, . . . , and S58 have one end connected to a corresponding part of the first resistor string 40. On the other hand, each of the switches S51, S52, . . . , and S58 have the other end connected in common.

In FIG. 6, a resistor R is connected to a stage preceding the resistor R41 of the first resistor string 40. However, it is not essential to provide this resistor R, and this resistor R may be omitted.

The second resistor string 60 is made up of eight resistors R61, R62, . . . , and R68 which are connected in series, and a voltage $V_A$ from the first resistor string 40 which is selected by the first switch group 50 is applied across the ends of the second resistor string 60. The second switch group 70 is made up of eight switches S71, S72, . . . , and S78, and each of the switches S71, S72, . . . , and S78 have one end connected to a corresponding part of the second resistor string 60. On the other hand, each of the switches S71, S72, . . . , and S78 have the other end connected in common.

The eight switches S51 through S58 forming the first switch group 50 are controlled by an 8-bit decode signal from the first decoder circuit 80, so that only one of the 8 switches S51 through S58 turns ON. Similarly, the eight switches S71 through S78 forming the second switch group 70 are controlled by an 8-bit decode signal from the second decoder circuit 81, so that only one of the eight switches S71 through S78 turns ON.

The second decoder circuit 81 receives three bits D0 through D2 of a digital control signal which are required to form the 8-bit decode signal, and the first decoder circuit 80 receives three bits D3 through D5 of the digital control signal which are required to form the 8-bit decode signal. The three bits D3 through D5 of the digital control signal will hereinafter be referred to as a first digital control signal, and the three bits D0 through D2 of the digital control signal will hereinafter be referred to as a second digital control signal. For example, these first and second digital control signals are supplied to the first and second decoder circuits 80 and 81 from an external control circuit (not shown).

Figure 7:
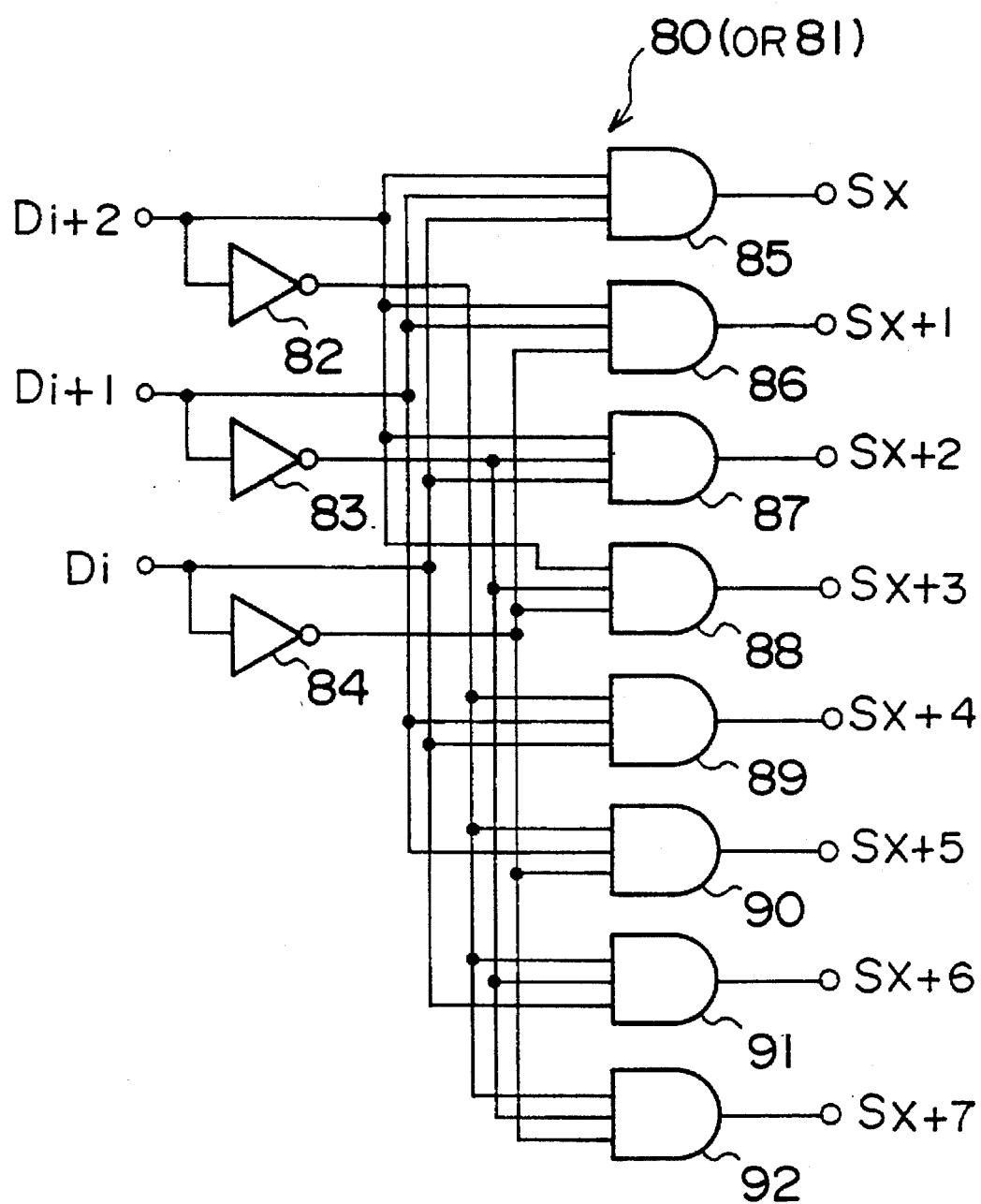
FIG. 7 is a circuit diagram showing an embodiment of a decoder circuit.

FIG. 7 shows an embodiment of the first decoder circuit 80. The second decoder circuit 81 has the same construction as the first decoder circuit 80 shown in FIG. 7.

In FIG. 7, $D_i$, $D_{i+1}$ and $D_{i+2}$ respectively correspond to the bits of the first or second digital control signal. In other words, these bits $D_i$, $D_{i+1}$ and $D_{i+2}$ correspond to the three bits of the first digital control signal if i=3, and correspond to the 3 bits of the second digital control signal if i=0.

In addition, $S_X$, $S_{X+1}$, $S_{X+2}$, . . . , and $S_{X+7}$ respectively correspond to the switches of the first or second switch group which are turned ON/OFF in response to the 8-bit decoder signal. In other words, if X=51, the switches $S_X$ through $S_{X+7}$ correspond to the switches S51 through S58 of the first switch group 50. On the other hand, if X=71, the switches $S_X$ through $S_{X+7}$ correspond to the switches S71 through S78 of the second switch group 70.

The first decoder circuit 80 (or second decoder circuit 81) includes inverters 82 through 84, and 3-input AND gates 85 through 92 which are connected as shown in FIG. 7. The inverters 82, 83 and 84 respectively invert the bits $D_{i+2}$, $D_{i+1}$ and $D_i$. Each of the 3-input AND gates 85 through 92 receive a predetermined combination of the bits $D_i$, $D_{i+1}$ and $D_{i+2}$ and inverted signals thereof, and outputs a high-level signal when all of the three input signals thereto have the high level.

In other words, according to the circuit construction shown in FIG. 7, the decoding operation is such that the AND gate 85 outputs a high-level signal (the switch $S_X$ turns ON) when the bits $D_i$, $D_{i+1}$ and $D_{i+2}$ are $[111_{(2)}]=7_{(10)}$, the AND gate 86 outputs a high-level signal (the switch $S_{X+1}$ turns ON) when $[110_{(2)}]=6_{(10)}$, the AND gate 87 outputs a high-level signal (the switch $S_{X+2}$ turns ON) when $[101_{(2)}]=5_{(10)}$, . . . , and the AND gate 92 outputs a high-level signal (the switch $S_{X+7}$ turns ON) when $[000_{(2)}]=5_{(10)}$.

Next, a description will be given of the operation of the digitally controlled variable gain circuit shown in FIG. 6 for a case where the resistances of the resistors forming the first and second resistor strings 40 and 60 are set as follows.

First Resistor String 40:
R41=3.55 kΩ
R42=2.37 kΩ
R43=1.52 kΩ
R44=0.95 kΩ
R45=0.60 kΩ
R46=0.38 kΩ
R47=0.23 kΩ
R48=0.40 kΩ

Second Resistor String 60:
R61=5.60 kΩ
R62=5.30 kΩ
R63=5.00 kΩ
R64=4.70 kΩ
R65=4.40 kΩ
R66=4.20 kΩ
R67=4.00 kΩ
R68=66.80 kΩ

In this case, the resistances of the first and second resistor strings 40 and 60 can be arranged in a logarithmic manner. Accordingly, it is possible to realize an attenuation in the range of 0 dB to −31.5 dB in steps of 0.5 dB between the analog input voltage $V_{IN}$ and the analog output voltage $V_{OUT}$. In order to guarantee a steady, even increase, a setting should be made so that a ratio of the voltage at one end of each resistor of the first resistor string 40 and the voltage at the other end via the respective resistor is a predetermined value, a ratio of the voltages at the ends of the second resistor string 60 is the predetermined value, and a ratio of the voltage at one end of the resistor of the second resistor string 60 and the voltage at the other end via this resistor is the same value for all of the resistors forming the second resistor string 60.

FIG. 8 shows the relationships of the contents of the first and second digital control signals, the switches which turn ON depending on these contents, and the attenuation of each stage of the resistor string.

As shown in FIG. 8 (a), the attenuation which is selected by the first digital control signal is the range of 0 dB to −28 dB in steps of 4 dB, which is large. On the other hand, as shown in FIG. 8 (b), the attenuation which is selected by the second digital control signal is the range of 0 dB to −3.5 dB in steps of 0.5 dB, which is small. Accordingly, between the analog input voltage $V_{IN}$ and the analog output voltage $V_{OUT}$, it is possible to obtain an attenuation in the combined range of 0 dB to −31.5 dB. In addition, since the adjustment width of the first digital control signal is 4 dB and large while the adjustment width of the second digital control signal is 0.5 dB and small, the former can be used for the rough adjustment of the attenuation and the latter can be used for the fine adjustment of the attenuation.

If the data D0 through D2 are input to the first decoder circuit 80 and the data D3 through D5 are input to the second decoder circuit 81 in FIG. 6, and the switches S51 through S58 shown in FIG. 8 (a) and the switches S71 through S78 shown in FIG. 8 (b) are interchanged, the first resistor string 40 and the first switch group 50 operate as a circuit part for making the fine adjustment in steps of 0.5 dB and the second resistor string 60 and the second switch group 70 operate as a circuit part for making the rough adjustment in steps of 4 dB. In other words, the fine adjustment width is given by $20 \log_{10}(V_A/V_{IN})$ and the rough adjustment is given by $20 \log_{10}(V_{OUT}/V_A)$ in this case.

According to this embodiment, it is possible to use the attenuations, that is, gains with respect to the analog input voltage $V_{IN}$, which are obtained in response to the first and second digital control signals in combination. As a result, it is possible to realize a variable control of the analog input voltage $V_{IN}$ in a wide range and with a high resolution.

From the point of view of the input impedance, it is desirable that the total resistance of the second resistor string 60 is set large. In this embodiment, the total resistance of the second resistor string 60 is set to 100 kΩ which is 10 times the total resistance of the first resistor string 40 which is 10 kΩ. By employing this setting, the input impedance becomes approximately 9.1 kΩ when the top switch S51 of the first switch group 50 turns ON, and the input impedance becomes approximately 10 kΩ when the bottom switch S58 of the first switch group 50 turns ON. In other words, it is possible to suppress the deviation of the input impedance caused at the time the gain is switched to approximately 10%.

Next, a description will be given of the operating principle of a second embodiment of the digitally controlled variable gain circuit according to the present invention, by referring to FIGS. 9 and 10. The object of this second embodiment is to guarantee a stable operation of an operational amplifier when operated by a low power source voltage.

Figure 9:
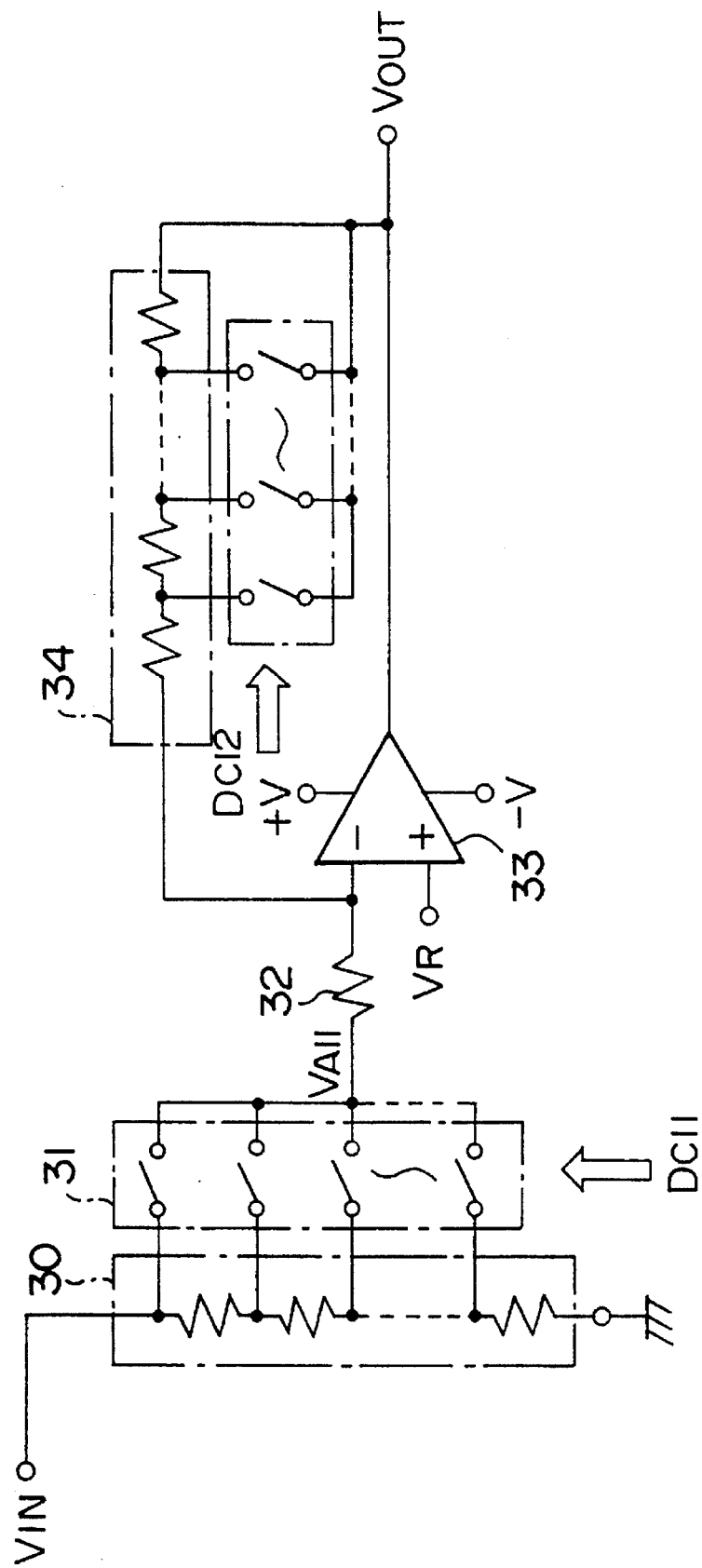
FIG. 9 is a circuit diagram for explaining the operating principle of a second embodiment of the digitally controlled variable gain circuit.

FIG. 9 shows an essential part of this second embodiment. In FIG. 9, an analog input voltage $V_{IN}$ is applied across the ends of a resistor string 30. A voltage generated at each part of the resistor string 30 is obtained as a voltage $V_{A11}$ by a switch group 31 which is selectively turned ON/OFF in response to a first digital control signal $D_{C11}$. The obtained voltage $V_{A11}$ is applied to an inverting input terminal of an operational amplifier 33 via an input resistor 32, and an analog output voltage $V_{OUT}$ is obtained from an output of the operational amplifier 33. A reference voltage $V_R$ which corresponds to an intermediate potential between power source voltages +V and −V, for example, is applied to a non-inverting input terminal of the operational amplifier 33. In addition, a feedback resistor 34 is connected between the output and the inverting input terminal of the operational amplifier 33, and the resistance of this feedback resistor 34 is varied in response to a second digital control signal $D_{C12}$.

Figure 10:
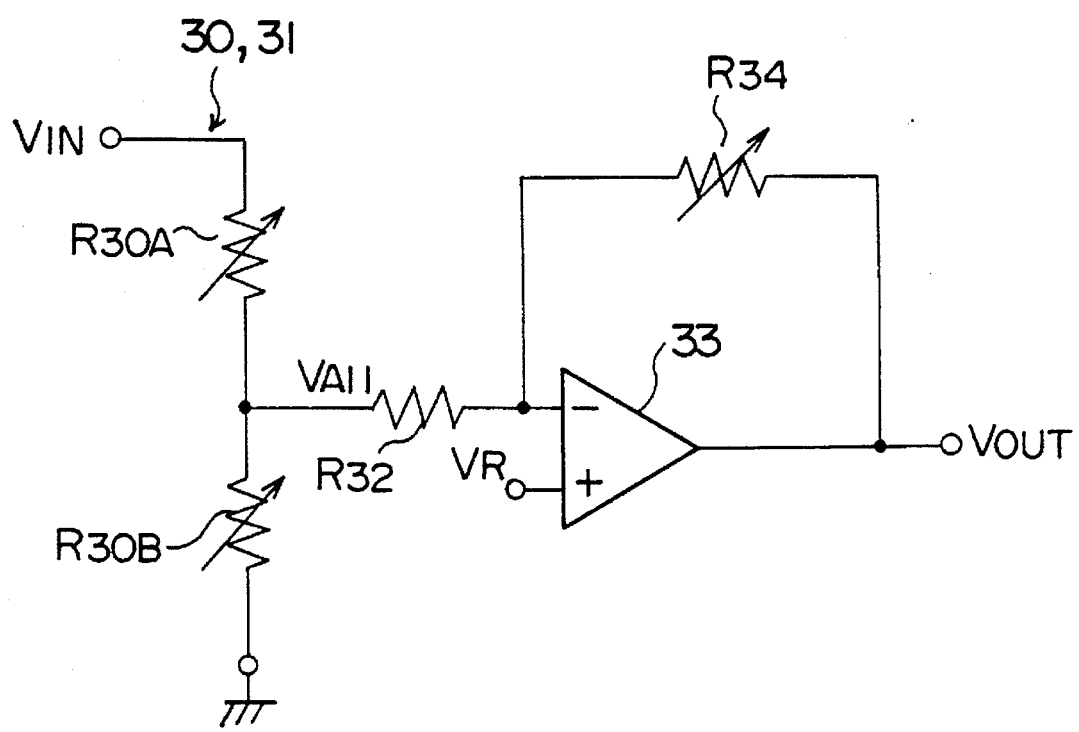
FIG. 10 is a diagram for explaining the operation of the second embodiment.

FIG. 10 is a diagram for explaining the operation of the second embodiment. In FIG. 10, $R_{30A}$ and $R_{30B}$ respectively indicate values of voltage dividing resistors of the resistor string 30 selected by the first digital control signal $D_{C11}$. In addition, $R_{32}$ indicates a value of an input resistance of the operational amplifier 33, and $R_{34}$ indicates a value of the feedback resistor 34 which is selected by the second digital control signal $D_{C12}$. The following formulas (3) and (4) can be derived from the relationships of these resistances and the voltages $V_{IN}$, $V_{A11}$ and $V_{OUT}$.

$$V_{A11}/V_{IN} = R_{30B} \cdot R_{32} / \{R_{30A}(R_{30B}+R_{32}) + R_{30B} \cdot R_{32}\} \quad (3)$$

$$V_{OUT}/V_{IN} = -(R_{34}/R_{32})V_{A11}/V_{IN} = -R_{30B} \cdot R_{34} / \{R_{30A}(R_{30B}+R_{32}) + R_{30B} \cdot R_{32}\} \quad (4)$$

As may be seen from the formula (3), the voltage $V_{A11}$ is dependent on the input resistance $R_{32}$ of the input resistor 32 of the operational amplifier 33, but is independent of the feedback resistance $R_{34}$ of the feedback resistor 34 of the operational amplifier 33. In other words, it is possible to set mutually independent voltage dividing ratios to the resistor string 30 and the feedback resistor 34. Hence, it is possible to obtain a number of voltage varying steps in multiple stages corresponding to a product of the two voltage dividing ratios of the resistor string 30 and the feedback resistor 34, and improve the control resolution without increasing the scale of the circuit. In addition, the operation point of the operational amplifier 33 is given by the reference voltage $V_R$, and will not fall outside the narrow operable range as in the conventional digitally controlled variable gain circuit even when operated by a low power source voltage.

Further, although the first embodiment can only attenuate the analog input voltage, this second embodiment can attenuate or amplify the analog input voltage.

Next, a more detailed description will be given of the second embodiment, by referring to FIGS. 11 and 12.

Figure 11:
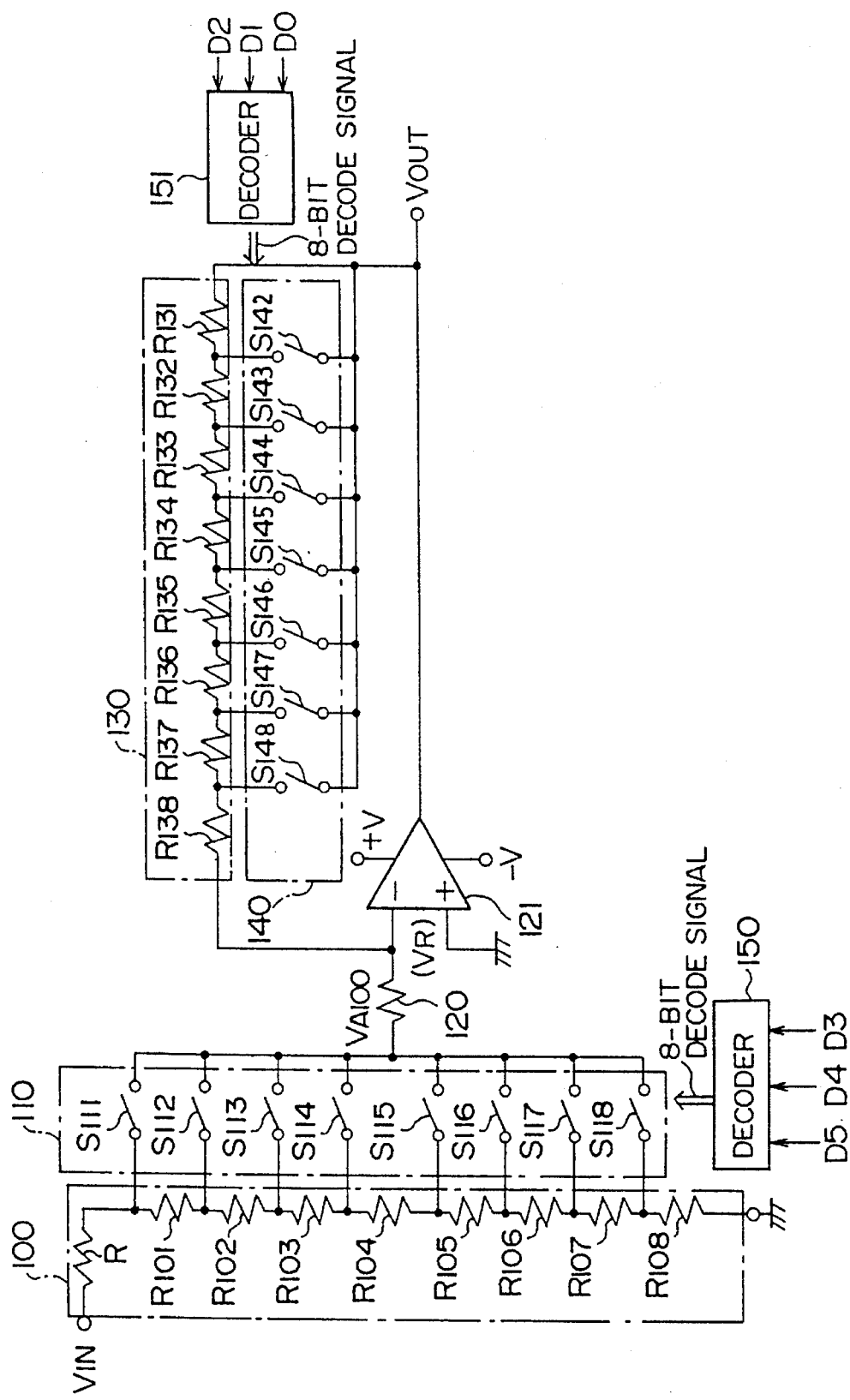
FIG. 11 is a circuit diagram showing the second embodiment.

FIG. 11 shows the second embodiment. As shown in FIG. 11, the digitally controlled variable gain circuit includes a first resistor string 100, a first switch group 110, an input resistor 120, an operational amplifier 121, a second resistor string 130, a second 10 switch group 140, a first decoder circuit 150, and a second decoder circuit 151.

The first resistor string 100 is made up of eight resistors R101, R102, ..., and R108 which are connected in series, and the analog input voltage $V_{IN}$ is applied across the ends of the first resistor string 100. FIG. 11 shows a case where a resistor R is connected to a stage preceding the resistor R101 of the first resistor string 100, however, it is not essential to provide the resistor R and this resistor R may be omitted. The first switch group 110 is made up of eight switches S111, S112, ..., and S118, and each of the switches S111 through S118 have one end connected to a corresponding part of the first resistor string 100. Each of the switches S111 through S118 of the first switch group 110 have the other end coupled in common to an inverting input terminal of the operational amplifier 121 via the input resistor 120.

The operational amplifier 121 is operated by two power source voltages, namely, a high potential side power source voltage +V and a low potential side power source voltage −V. A reference voltage $V_R$ is applied to a non-inverting input terminal of the operational amplifier 121. For example, this reference voltage $V_R$ is set to an intermediate potential between the two power source voltages +V and −V, such as 0 V. Hence, the operational amplifier 121 maintains its operation point to the reference voltage $V_R$ regardless of the power source voltages.

The second resistor string 130 is made up of eight resistors R131, R132, . . . , an R138 which are connected in series, and the ends of the second resistor string 130 are respectively connected to the inverting input terminal and an output terminal of the operational amplifier 121. The second switch group 140 is made up of eight switches S141, S142, . . . , and S148, and each of the switches S141 through S148 have one end connected to a corresponding part of the second resistor string 130. On the other hand, each of the switches S141 through S148 have the other end connected in common to the output terminal of the operational amplifier 121.

Accordingly, the second resistor string 130 is used as the feedback resistor of the operational amplifier 121, and the second switch group 140 is used for varying the resistance of the feedback resistor.

The eight switches S111 through S118 of the first switch group 110 are controlled by an 8-bit decode signal from a first decoder circuit 150, so that only one of the switches S111 through S118 turns ON. Similarly, the eight switches S141 through S148 of the second switch group 140 are controlled by an 8-bit decode signal from a second decoder circuit 151, so that only one of the switches S141 through S148 turns ON. A description of the circuit constructions of the first and second decoder circuits 150 and 151 will be omitted, because the first and second decoder circuit 150 and 151 may have circuit constructions similar to those of the first and second decoder circuits 80 and 81 described above.

One of the eight switches S111 through S118 forming the first switch group 110 turns ON in response to the 8-bit decode signal which is output from the first decoder circuit 150 based on the first digital control signal which is made up of the bits D3 through D5. As a result, the attenuation of the analog input voltage $V_{IN}$ is determined to a predetermined value dependent on the switch which is turned ON.

As shown in FIG. 12 (a), the attenuation can be varied in a range of 0 dB to −28 dB in steps of 4 dB, which is large, if the resistances of the resistors R101 through R108 forming the first resistor string 100 are set as follows.

First Resistor String 100:
R101=3.55 kΩ
R102=2.37 kΩ
R103=1.52 kΩ
R104=0.95 kΩ
R105=0.60 kΩ
R106=0.38 kΩ
R107=0.23 kΩ
R108=0.40 kΩ

The analog input voltage $V_{IN}$ is thus attenuated into a voltage $V_{A100}$ shown in FIG. 11, and is further amplified to the analog output voltage $V_{OUT}$ by the operational amplifier 121. The amplification of the operational amplifier 121 is variable in multiple stages by selectively turning ON one of the eight switches S141 through S148 which form the second switch group 140 in response to the 8-bit decode signal output from the second decoder circuit 151 based on the second digital control signal of the bits D0 through D2.

As shown in FIG. 12 (b), the amplification can be varied in a range of 0 dB to −3.5 dB in steps of 0.5 dB, which is small, if the resistances of the resistors R131 through R138 forming the second resistor string 130 are set as follows.

Second Resistor String 130:
R131=5.60 kΩ
R132=5.30 kΩ
R133=5.00 kΩ
R134=4.70 kΩ
R135=4.40 kΩ
R136=4.20 kΩ
R137=4.00 kΩ
R138=66.80 kΩ

Therefore, according to this embodiment, it is possible to obtain the attenuation in a large range of from 0 dB to −31.5 dB in steps of 0.5 dB, between the analog input and output voltages $V_{IN}$ and $V_{OUT}$. In addition, because the operation point of the operational amplifier 121 is maintained to the reference voltage $V_R$ which corresponds to an intermediate potential between the two power source voltages +V and −V in this embodiment, it is possible to eliminate the problem of the tolerable operation range when the operational amplifier 121 is operated by a lower power source voltage. In other words, it is possible to prevent the operation point of the operational amplifier 121 from falling outside the narrow operation range, and accordingly guarantee a stable operation of the operational amplifier 121 when operated by the low power source voltage.

Figure 13:
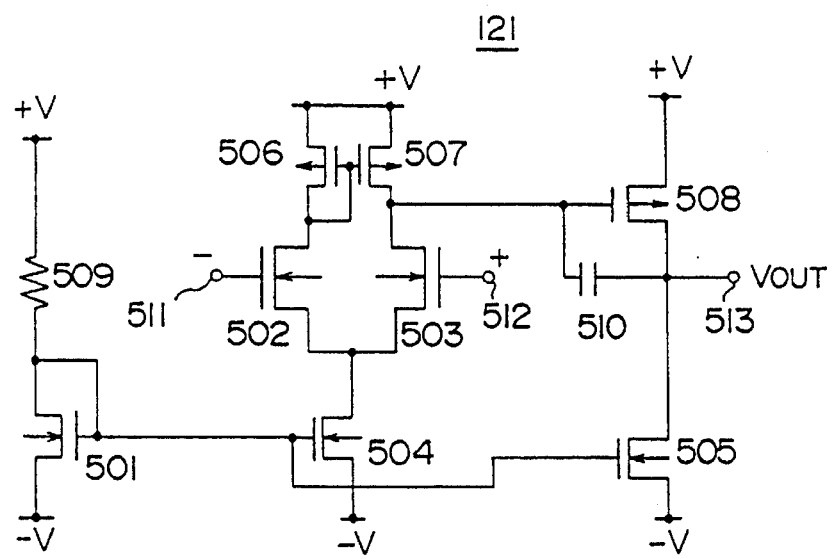
FIG. 13 is a circuit diagram showing an embodiment of an operational amplifier.

FIG. 13 shows an embodiment of the operational amplifier 121. The operational amplifier 121 shown in FIG. 13 includes N-channel transistors 501 through 505, P-channel transistors 506 through 508, a resistor 509 and a capacitor 510 which are connected as shown between power sources which respectively supply the power source voltages +V and −V. A terminal 511 which is connected to the N-channel transistor 502 forms the inverting input terminal of the operational amplifier 121, and a terminal 512 which is connected to the N-channel transistor 503 forms the non-inverting input terminal of the operational amplifier 121. The analog output voltage $V_{OUT}$ is output from an output terminal 513 of the operational amplifier 121. This operational amplifier 121 shown in FIG. 13 is provided with a phase compensation means, however, the construction of the operational amplifier 121 is of course not limited to that shown in FIG. 13 and various constructions may be used.

Next, a mope detailed description will be given of the problem encountered in the conventional digitally controlled variable gain circuit which uses an operational amplifier, so as to facilitate understanding of the effects of the second embodiment.

Figure 3:
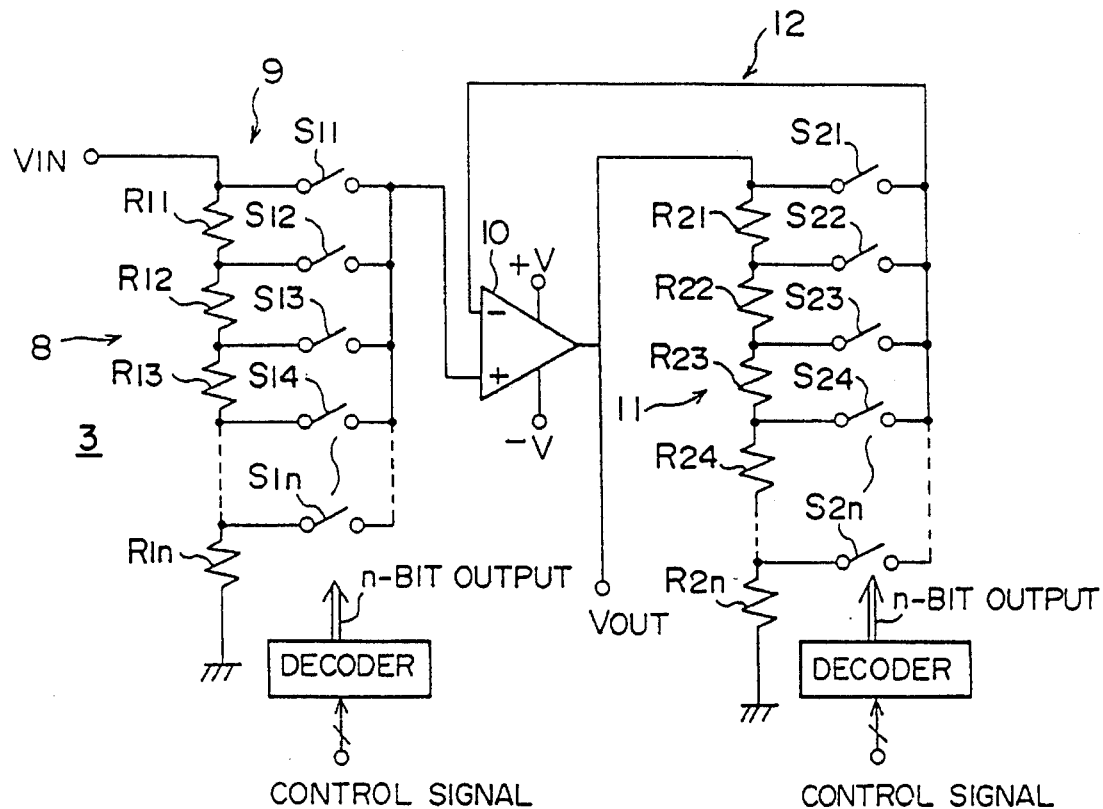
FIG. 3 is a circuit diagram showing a second example of the conventional digitally controlled variable gain circuit.
Figure 14B:
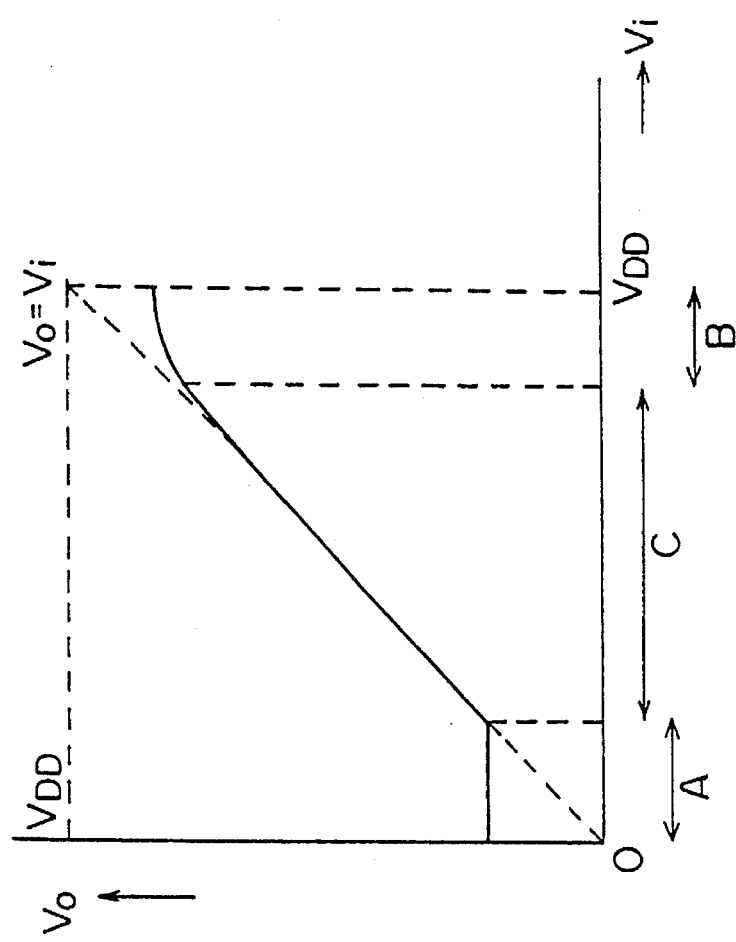
FIG. 14(A) and FIG. 14(B) are diagrams for explaining the operation range of the operational amplifier.
Figure 14A:
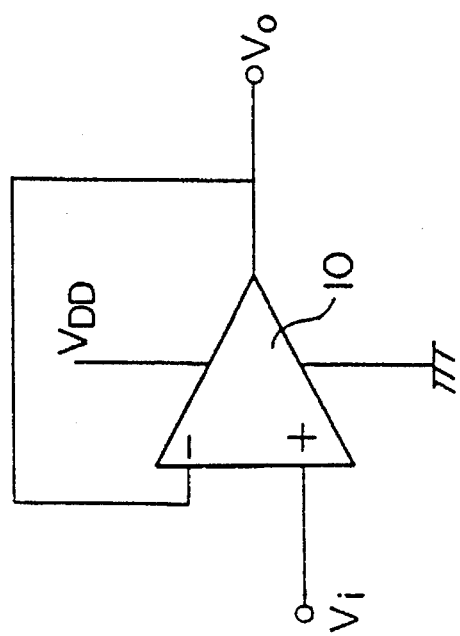

FIG. 14 (a) shows the operational amplifier 10 of the conventional digitally controlled variable gain circuit shown in FIG. 3. For the sake of convenience, the high power source voltage +V is assumed to be $V_{DD}$, and the low power source voltage −V is assumed to be the ground voltage. The analog output voltage Vo of the operational amplifier 10 is fed back to the inverting input terminal of the operational amplifier 10, while the analog input voltage Vi is input to the non-inverting input terminal of the operational amplifier 10. The analog input voltage Vi should be input to the operational amplifier 10 within a range such that the output voltage Vo can follow the input voltage Vi when the operational amplifier 10 is used as a voltage follower.

FIG. 14 (b) shows the input voltage Vi versus output voltage Vo characteristic of the operational amplifier 10 shown in FIG. 14 (a). As shown in FIG. 14 (b), the output voltage Vo is not equal to the input voltage Vi in regions A and B, and the operation of the operational amplifier 10 is unstable in these regions A and B. In these regions A and B, the output voltage Vo is approximately constant regardless of the input voltage Vi, and thus, a tolerable operation range C of the operational amplifier 10 becomes narrower as the power source voltage $V_{DD}$ decreases, as shown in FIGS. 15(a) and 15(b).

Figure 15A:
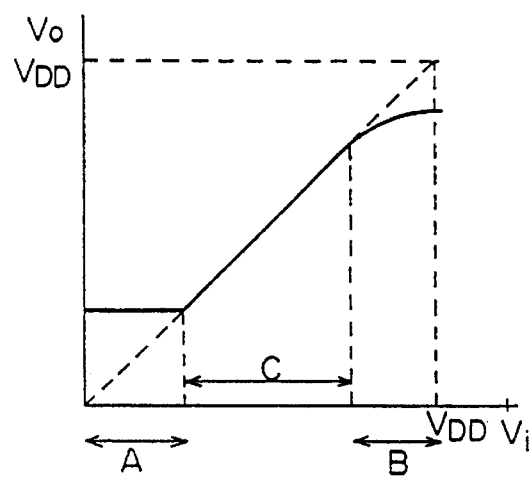
FIG. 15(A) and FIG. 15(B) are diagrams for explaining the narrowing of the operation range of the operational amplifier.
Figure 15B:
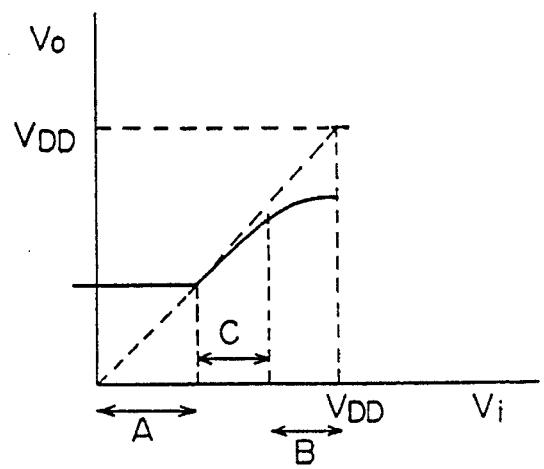

Therefore, it may be seen from FIGS. 15(a) and 15(b) that the voltage amplitude which can be treated becomes extremely small as the power source voltage $V_{DD}$ decreases.

However, according to the second embodiment of the present invention, the operation point of the operational amplifier 121 is maintained to the reference voltage $V_R$ which corresponds to the intermediate voltage between the two power source voltages +V and −V, for example. For this reason, it is possible to maintain the operation point of the operational amplifier 121 within the tolerable operation range even if the operational amplifier 121 is operated by a low power source voltage, and thus guarantee a stable operation of the operational amplifier 121.

Next, a description will be given of the significance of providing the input resistor 120 in the second embodiment shown in FIG. 11, although the gain adjustment is possible without the use of the input resistor 120.

First, by providing the input resistor 120, it is possible to make resistance of the first resistor string 100 small, and enable free setting of the ratio between the resistances of the first resistor string 100 and the second resistor string 130.

Figure 16A:
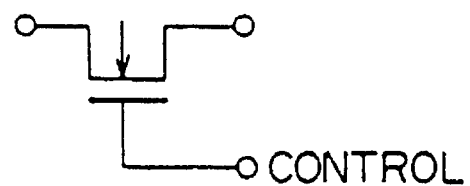
FIG. 16(A), FIG. 16(B) and FIG. 16(C) are circuit diagrams showing embodiments of a switch.
Figure 16B:
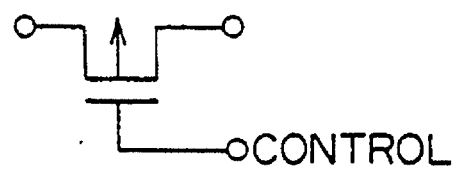
Figure 16C:
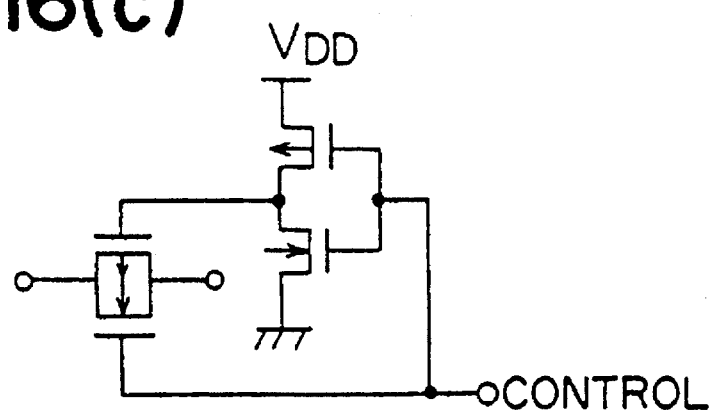

Second, even if the resistance of the first resistor string 100 is small, the circuit is virtually unaffected by an error caused by the ON-resistance of the first switch group 110. In other words, each of the switches S111 through S118 of the first switch group 110 is made up of one or more transistors, as shown in FIGS. 16(a), 16(b) and 16(c). Of course, the switch may have other constructions, and the switches S141 through S148 of the second switch group 140 may have the same construction as the switches S111 through S118 of the first switch group 110. Hence, when one switch of the first switch group 110 turns ON, the input resistance of the operational amplifier 121 would change due to the ON-resistance of this switch if the input resistor 120 were not provided. However, by setting the resistance of the input resistor 120 to an appropriately large value compared to the ON-resistance of the switch, it is possible to neglect the ON-resistance of the switch, and accordingly prevent the circuit operation from being affected by the ON-resistance of the switch.

Third, if the resistance of the first resistor string 100 is relatively small compared to the resistance of the input resistor 120, the input impedance of the digitally controlled variable gain circuit becomes approximately constant even if the gain is switched.

Figure 1:
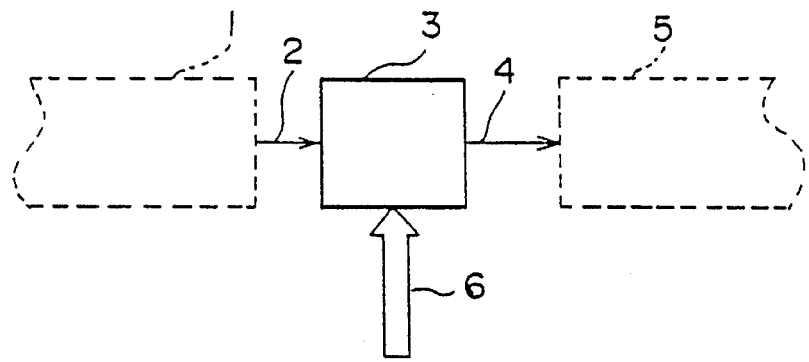
FIG. 1 is a diagram showing a general application of a digitally controlled variable gain circuit.
Figure 2:
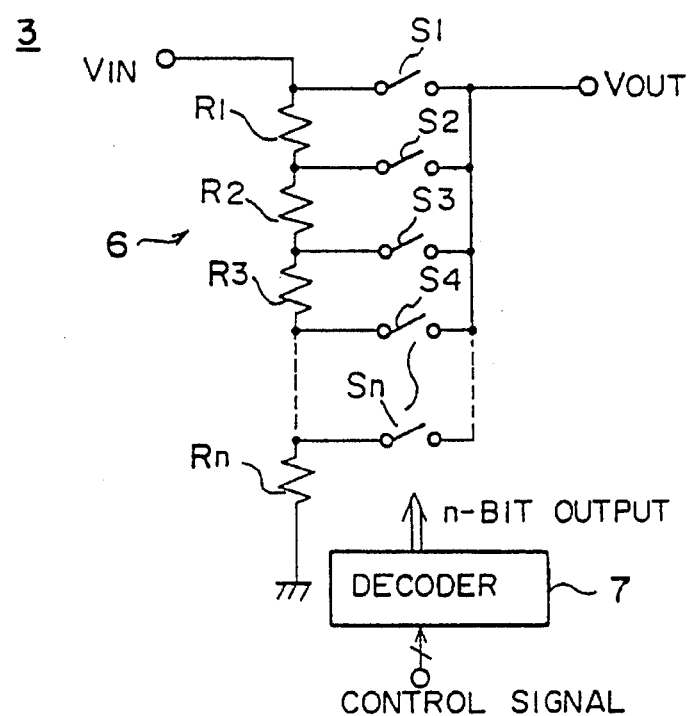
FIG. 2 is a circuit diagram showing a first example of a conventional digitally controlled variable gain circuit.

On the other hand, the digitally controlled variable gain circuit proposed in FIG. 1 of the Japanese Laid-Open Patent Application No. 3-255722 referred above merely employs a method of switching the switches So through S2 so as to switch the input resistance of the operational amplifier A1, and no fixed input resistor is connected to the operational amplifier A1. Therefore, the above described first through third features of the second embodiment of the present invention cannot be obtained in the Japanese Laid-Open Patent Application No. 3-255722.

Further, the present invention is not limited to these embodiments, but various variations and modifications may be made without departing from the scope of the present invention.

What is claimed is:

1. A digitally controlled variable gain circuit which receives an analog input voltage and produces an analog output voltage, the digitally controlled variable gain circuit comprising:

a first resistor string having first and second ends and comprising a plurality of resistors connected in series between the first and second ends, said analog input voltage being applied across the first and seconds ends of the first resistor string;

first selection means, coupled to said first resistor string and responsive to a first digital control signal, for providing a selectively determinable voltage divided output from said first resistor string;

an input resistor of a fixed resistance and having a first resistor end and a second resistor end, the voltage divided output being provided to the first resistor end;

an operational amplifier comprising:
an inverting input terminal which is connected to the second resistor end of the input resistor and is supplied with the voltage divided output provided by said first selection means via said input resistor,
a non-inverting input terminal supplied with a reference voltage, and
an output terminal which provides the analog output voltage; and feedback means, coupled between the output terminal and the inverting input terminal of said operational amplifier and responsive to a second digital control signal, for selectively determining a feedback resistance and for feeding back the analog output voltage provided by the output terminal of said operation amplifier to the inverting input terminal of said operational amplifier via the feedback resistance.

2. The digitally controlled variable gain circuit as claimed in claim 1, wherein the operational amplifier is supplied with first and second power source voltages and said reference voltage is set to an intermediate voltage between the first and second power source voltages.

3. The digitally controlled variable gain circuit as claimed in claim 2, wherein:

the resistance of each resistor within said first resistor string is set so that a ratio of a voltage at one end of the respective resistor and a voltage at the other end of the respective resistor is a predetermined value; and the resistance of each resistor forming said second resistor string is set so that a ratio of a voltage at the first end of the second resistor string and a voltage at the second end of the second resistor string is the predetermined value, and a ratio of a voltage at one end of each resistor within said second resistor string and a voltage at the other end of the respective resistor is the same value for all of the resistors forming said second resistor string.

4. The digitally controlled variable gain circuit as claimed in claim 2, wherein said first and second resistor strings have mutually independent voltage dividing ratios.

5. The digitally controlled variable gain circuit as claimed in claim 2, wherein following formulas ((3) and (4)) are satisfied:

$$V_{A11}/V_{IN} = R_{30B} \cdot R_{32}/\{R_{30A}(R_{30B} + R_{32}) + R_{30B} \cdot R_{32}\}$$

$$V_{OUT}/V_{IN} = -(R_{34}/R_{32})V_{A11}/V_{IN}$$
$$= -R_{30B} \cdot R_{34}/\{R_{30B} + R_{32}) + R_{30B} \cdot R_{32}\}$$

where $V_{IN}$ denotes the analog input voltage, $V_{A11}$ denotes the voltage divided output provided by the first selection means, $V_{OUT}$ denotes the analog output voltage, $R_{30A}$ and $R_{30B}$ denote voltage dividing resistances of said first resistor string resulting from the voltage divided output determined by said first selection means in response to the first digital control signal, $R_{32}$ denotes the fixed resistance of the input resistor and $R_{34}$ denotes the feedback resistance of said second resistor string determined by the feedback means in response to the second digital control signal.

6. The digitally controlled variable gain circuit as claimed in claim 2, wherein the first and second digital control signals respectively comprise predetermined bits of a single control signal.

7. The digitally controlled variable gain circuit as claimed in claim 2, wherein said first resistor string and said first selection means operate to roughly adjust a gain of the analog input voltage, and said second resistor string and said second selection means operate to finely adjust the gain of the analog input voltage.

8. The digitally controlled variable gain circuit as claimed in claim 1, wherein said feedback means comprises:

a second resistor string having first and second ends respectively coupled to the output terminal and the inverting input terminal of said operational amplifier, and comprising a plurality of resistors connected in series between the first and second ends; and second selection means, coupled to said second resistor string and responsive to the second digital control signal, for selecting the feedback resistance of said second resistor string.

9. The digitally controlled variable gain circuit as claimed in claim 8, wherein the resistance of the first resistor string is small compared to the resistance of the second resistor string.

10. The digitally controlled variable gain circuit as claimed in claim 1, wherein said first selection means comprises a plurality of switches respectively having an ON-resistance when turned ON, and said input resistor has a fixed resistance such that the ON-resistance of each switch of said first selection means is negligibly small compared to the fixed resistance of said input resistor.

11. The digitally controlled variable gain circuit as claimed in claim 1, wherein the first selection means comprises a tap point for partitioning the resistors of the first resistor string to provide a voltage divided output, the input resistor being directly connected to the tap point.

12. The digitally controlled variable gain circuit as claimed in claim 1, wherein:

the resistance of each resistor within said first resistor string is set so that a ratio of a voltage at one end of the respective resistor and a voltage at the other end of the respective resistor is a predetermined value; and the resistance of each resistor forming said second resistor string is set so that a ratio of a voltage at the first end of the second resistor string and a voltage at the second end of the second resistor string is the predetermined value, and a ratio of a voltage at one end of each resistor within said second resistor string and a voltage at the other end of the respective resistor is the same value for all of the resistors forming said second resistor string.

13. The digitally controlled variable gain circuit as claimed in claim 1, wherein said first and second resistor strings have mutually independent voltage dividing ratios.

14. The digitally controlled variable gain circuit as claimed in claim 1, wherein following formulas are satisfied:

$$V_{A11}/V_{IN} = R_{30B} \cdot R_{32}/\{R_{30A}(R_{30B} + R_{32}) + R_{30B} \cdot R_{32}\}$$

$$V_{OUT}/V_{IN} = -(R_{34}/R_{32})V_{A11}/V_{IN}$$
$$= -R_{30B} \cdot R_{34}/\{R_{30B} + R_{32}) + R_{30B} \cdot R_{32}\}$$

where $V_{IN}$ denotes the analog input voltage, $V_{A11}$ denotes the voltage divided output provided by the first selection means, $V_{OUT}$ denotes the analog output voltage, $R_{30A}$ and $R_{30B}$ denote voltage dividing resistances of said first resistor string resulting from the voltage divided output determined by said first selection means in response to the first digital control signal, $R_{32}$ denotes the fixed resistance of the input resistor and $R_{34}$ denotes the feedback resistance of said second resistor string determined by the feedback means in response to the second digital control signal.

15. The digitally controlled variable gain circuit as claimed in claim 1, wherein the first and second digital control signals respectively comprise predetermined bits of a single control signal.

16. The digitally controlled variable gain circuit as claimed in claim 1, wherein said first resistor string and said first selection means operate to roughly adjust a gain of the analog input voltage, and said second resistor string and said second selection means operate to finely adjust the gain of the analog input voltage.

17. A digitally controlled variable gain circuit which receives an analog input voltage and produces an analog output voltage the digitally controlled variable gain circuit comprising:

a first resistor string having first and second ends and comprising a plurality of resistors connected in series between the first and second ends, the second end of the first resistor string being grounded and said analog input voltage being applied across the first and second ends of the first resistor string;

first selection means, coupled to said first resistor string and responsive to a first digital control signal, for providing a selectively determinable voltage divided output from said first resistor string;

a second resistor string having first and second ends and comprising a plurality of resistors connected in series between the first and second ends, the second end of the second resistor string being grounded and the voltage divided output provided by said first selection means being applied directly across the first and second ends of the second resistor string without being passed through a buffer amplifier between the first and second resistor strings; and second selection means, coupled to said second resistor string and responsive to a second digital control signal, for providing a selectively determinable voltage divided output from said second resistor string as the analog output voltage, wherein the resistance of each resistor within said first resistor string is set so that a ratio of a voltage at one end of the respective resistor and a voltage at the other end of the respective resistor is a predetermined value, and the resistance of each resistor forming said second resistor string is set so that a ratio of a voltage at the first end of the second resistor string and a voltage at the second end of the second resistor string is the predetermined value, and a ratio of a voltage at one end of each resistor within said second resistor string and a voltage at the other end of the respective resistor is the same value for all of the resistors forming said second resistor string.

18. The digitally controlled variable gain circuit as claimed in claim 17, wherein said first and second resistor strings have mutually independent voltage dividing ratios.

19. The digitally controlled variable gain circuit as claimed in claim 17, wherein the first and second digital control signals respectively comprise predetermined bits of a single control signal.

20. The digitally controlled variable gain circuit as claimed in claim 17, wherein said first resistor string and said first selection means operate to roughly adjust an attenuation of the analog input voltage, and said second resistor string and said second selection means operate to finely adjust the attenuation of the analog input voltage.

21. The digitally controlled variable gain circuit as claimed in claim 17, wherein the input impedance of the first resistor string is small compared to the impedance of the second resistor string.

22. The digitally controlled variable gain circuit as claimed in claim 17, wherein the voltage divided output provided by the first selection means is directly applied across the first and second ends of the second resistor string.

23. The digitally controlled variable gain circuit as claimed in claim 17, wherein the first selection means comprises a tap point for partitioning the resistors of the first resistor string, the tap point being directly connected to the second resistor string.

24. A digitally controlled variable gain circuit which receives an analog input voltage and produces an analog output voltage, the digitally controlled variable gain circuit comprising:

a first resistor string having first and second ends and comprising a plurality of resistors connected in series between the first and second ends, the second end of the first resistor string being grounded and said analog input voltage being applied across the first and second ends of the first resistor string;

first selection means, coupled to said first resistor string and responsive to a first digital control signal, for providing a selectively determinable voltage divided output from said first resistor string;

a second resistor string having first and second ends and comprising a plurality of resistors connected in series between the first and second ends, the second end of the second resistor string being grounded and the voltage divided output provided by said first selection means being applied directly across the first and second ends of the second resistor string without being passed through a buffer amplifier between the first and second resistor strings; and second selection means, coupled to said second resistor string and responsive to a second digital control signal, for providing a selectively determinable voltage divided output from said second resistor string as the analog output voltage, wherein the following formulas are satisfied:

$$V_{A1}/V_{IN} = \{R_{20B}(R_{22A} + R_{22B})\}/ \{R_{20A}(R_{20B} + R_{22A} + R_{22B}) + R_{20B}(R_{22A} + R_{22B})\}$$

$$\begin{aligned}V_{OUT}/V_{IN} &= \{R_{22B}/(R_{22A} + R_{22B})\}V_{A1}/V_{IN} \\ &= R_{20B} \cdot R_{2B}/\{R_{20A}(R_{20B} + R_{22A} + R_{22B}) + R_{20B}(R_{22A}R_{22B})\}\end{aligned}$$

where $V_{IN}$ denotes the analog input voltage, $V_{A1}$ denotes the voltage divided output provided by the first selection means, $V_{OUT}$ denotes the analog output voltage, $R_{20A}$ and $R_{20B}$ denote voltage dividing resistances of said first resistor string resulting from the voltage divided output determined by said first selection means in response to the first digital control signal, and $R_{22A}$ and $R_{22B}$ denote voltage dividing resistances of said second resistor string resulting from the voltage divided output determined by said second selection means in response to the second digital control signal.

25. The digitally controlled variable gain circuit as claimed in claim 24, wherein said first and second resistor strings have mutually independent voltage dividing ratios.

26. The digitally controlled variable gain circuit as claimed in claim 24, wherein the first and second digital control signals respectively comprise predetermined bits of a single control signal.

27. The digitally controlled variable gain circuit as claimed in claim 24, wherein said first resistor string and said first selection means operate to roughly adjust an attenuation of the analog input voltage, and said second resistor string and said second selection means operate to finely adjust the attenuation of the analog input voltage.

28. The digitally controlled variable gain circuit as claimed in claim 24, wherein the input impedance of the first resistor string is small compared to the impedance of the second resistor string.

29. The digitally controlled variable gain circuit-as claimed in claim 24, wherein the voltage divided output provided by the first selection means is directly applied across the first and second ends of the second resistor string.

30. The digitally controlled variable gain circuit as claimed in claim 24, wherein the first selection means comprises a tap point for partitioning the resistors of the first resistor string, the tap point being directly connected to the second resistor string.

* * * * *

UNITED STATES PATENT AND TRADEMARK OFFICE
CERTIFICATE OF CORRECTION

PATENT NO.   : 5,523,721
DATED        : June 4, 1996
INVENTOR(S)  : Yuji SEGAWA, et al.

It is certified that error appears in the above-indentified patent and that said Letters Patent is hereby corrected as shown below:

Column 1, line 42, delete "sign" and insert therefor --signal--;
    Line 55, delete the question mark ("?") and insert therefor --7--;
    Line 57, delete "i" and insert therefor --is--;
    Line 59, after "decoder", insert --7--;
    Line 63, delete the question mark ("?") and insert therefor --7--.
Column 10, line 36, delete "mope" and insert therefor --more--.
Column 12, line 46, delete "((3) and (4))".
Column 14, line 14, after "voltage", insert a comma (",");
    Line 40, delete the comma (","), second occurrence.
Column 16, line 3, delete "$R_{2B}$" and insert therefor --$R_{22B}$--;
    Line 4, insert an addition sign ("+") between "$R_{22A}$" and "$R_{22B}$";
    Line 36, delete the dash ("-").

Signed and Sealed this

Twenty-seventh Day of August, 1996

Attest:

BRUCE LEHMAN

*Attesting Officer*     *Commissioner of Patents and Trademarks*